(12) United States Patent
Morishita et al.

(10) Patent No.: US 7,012,666 B2
(45) Date of Patent: Mar. 14, 2006

(54) DISPLAY, METHOD OF MANUFACTURING DISPLAY AND APPARATUS FOR MANUFACTURING DISPLAY

(75) Inventors: Hitoshi Morishita, Kumamoto (JP); Hiroshi Ueda, Kumamoto (JP)

(73) Assignee: Advanced Displays, Inc., Kumamoto (JP)

( * ) Notice: Subject to any disclaimer, the term of this patent is extended or adjusted under 35 U.S.C. 154(b) by 76 days.

(21) Appl. No.: 10/691,736

(22) Filed: Oct. 23, 2003

(65) Prior Publication Data

US 2004/0085505 A1 May 6, 2004

(30) Foreign Application Priority Data

Oct. 25, 2002 (JP) .............................. 2002-311531

(51) Int. Cl.
*G02F 1/1345* (2006.01)
(52) U.S. Cl. ...................................... 349/149; 349/151
(58) Field of Classification Search ................ 349/149, 349/150, 151, 152; 428/209
See application file for complete search history.

(56) References Cited

U.S. PATENT DOCUMENTS 6,492,008 B1 * 12/2002 Amagi et al. ................ 428/209
6,917,408 B1 *  7/2005 Nishino ....................... 349/149

FOREIGN PATENT DOCUMENTS

JP           338515/2000      2/2001
JP            51618/2001     12/2001

* cited by examiner

*Primary Examiner*—Toan Ton

(57) ABSTRACT

A display including: a scan line for driving pixels formed on an insulating substrate; a signal line which crosses the scan line; and a driving circuit connected to the signal line and, in a region other than a display region constructed by the pixels, directly mounted on the insulating substrate. A warp amount of a portion corresponding to the region in which the circuit is mounted, in a face opposite to the side of insulating substrate, on which the driving circuit is mounted, is 2 μm or less. The warp amount of the insulating substrate, which occurs when the driving circuit is directly mounted on a terminal on the insulating substrate, is set to 2 μm or less, and the display realizing suppressed luminance nonuniformity and high display quality can be obtained.

2 Claims, 3 Drawing Sheets

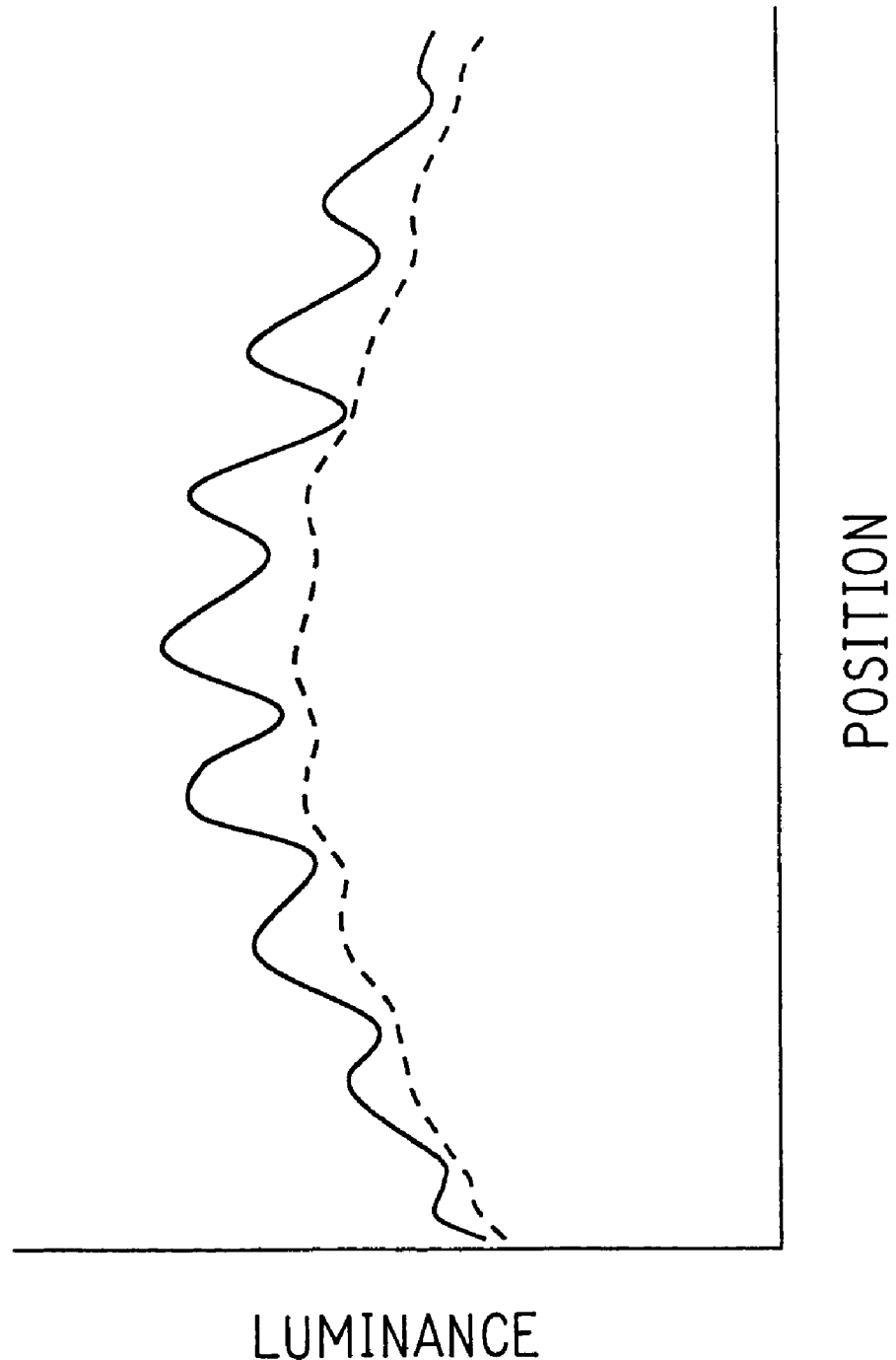

DISPLAY, METHOD OF MANUFACTURING DISPLAY AND APPARATUS FOR MANUFACTURING DISPLAY

CROSS-REFERENCE TO RELATED APPLICATION

Priority is claimed under 35 U.S.C. § 119 from Japanese application 2002-311531 filed Oct. 25, 2002.

BACKGROUND OF THE INVENTION

1. Technical Field

The present invention relates to a display in which a driving circuit is directly mounted on an insulating substrate, a method of manufacturing the same, and an apparatus for manufacturing a display and is, particularly, suitably applied to a liquid crystal display.

2. Discussion of Related Art

In recent years, as a cheaper method of manufacturing a display such as a liquid crystal display, COG (Chip On Glass) method for directly mounting a driving circuit on an insulating substrate is employed more and more. The COG method is a method of directly mounting a driving circuit on which Au bumps are formed onto terminals formed around an insulating substrate by using an anisotropic conductive film. In the case of thermo-compression bonding the driving circuit to the insulating substrate by using the method, since the size of a thermo-compression bonding tool is usually about the same as that of the driving circuit, the driving circuit thermally expands. However, the portion of the insulating substrate just below the driving circuit is to thermally expand whereas the other portion is held in a state at almost normal temperature, so that the insulating substrate just below the driving circuit cannot expand. Consequently, the driving circuit and a terminal on the insulating substrate are bonded to each other in such a state anisotropic conductive film and cured. When the temperature of the portion decreases to the normal temperature, distortion remains in both the driving circuit and the insulating substrate, so that the driving circuit and the insulating substrate are warped. In such a state, there occurs a problem that the refractive index in the insulating substrate locally changes due to a stress of the warp and a luminance nonuniformity occurs in a display. The luminance nonuniformity occurs conspicuously particularly in a region where an interval with the driving circuit being narrow, for example, near the region in which the driving circuit connected to a signal line over which a video signal is supplied to a pixel in a display region is mounted.

To solve the problem, in the case of a conventional display in which the driving circuit is directly mounted on the insulating substrate, in a peripheral portion of a display panel, a lead electrode from an internal electrode of a liquid crystal display panel is exposed to one of the substrates, a semiconductor device is mounted on the substrate by an anisotropic conductive adhesive, and the thickness d1 of the mounted semiconductor device is set to satisfy the relation of (thickness d1 of the semiconductor device)/(thickness ID of the substrate on which the semiconductor device is mounted) ½, thereby controlling a warp of the liquid crystal display panel (refer to, for example, Japanese Unexamined Patent Publication No. 338515/2000 (Table 1)).

According to another conventional technique, a warp suppression piece is disposed between neighboring semiconductor devices mounted, a warp occurring between the semiconductor devices can be suppressed by the warp suppression piece (refer to, for example, Japanese Unexamined Patent Publication No. 51618/2001 (p. 4, FIG. 1).

In the conventional technique of Japanese Unexamined Patent Publication No. 338515/2000, there is proposed a method of setting the thickness of the driving circuit to half of the insulating substrate or less, thereby suppressing the warp amount of the insulating substrate to 5 $\mu$m or less. However, when the warp amount of 5 $\mu$m exists, although luminance nonuniformity is lessened, there occurs a problem that luminance nonuniformity is easily visually recognized, for example, when black is displayed on the whole screen. Further, in the conventional technique of Japanese Unexamined Patent Publication No. 51618/2001, a warp which occurs between neighboring semiconductor devices can be suppressed, but a warp in a portion in which the driving circuit is mounted is not suppressed. As a result, luminance nonuniformity occurs, and a problem of poor display also arises.

SUMMARY OF THE INVENTION

The invention has been achieved in consideration of the problems and its object is to provide a display in which a driving circuit is directly mounted on an insulating substrate and which realizes high display quality without luminance nonuniformity, a method of manufacturing the same, and an apparatus for manufacturing the display.

The invention provides a first display including: a scan line for driving pixels formed on an insulating substrate; a signal line which crosses the scan line; and a driving circuit connected to the signal line and, in a region other than a display region constructed by the pixels, directly mounted on the insulating substrate, wherein a warp amount of a portion corresponding to the region in which the driving circuit is mounted, in a face opposite to the side of the insulating substrate, on which the driving circuit is mounted, is 2 $\mu$m or less.

A second display of the invention is characterized in that, in the first display, the driving circuit and a terminal on the insulating substrate are connected to each other by an anisotropic conductive film.

According to the invention, there is also provided a first method of manufacturing a display including: a scan line for driving pixels formed on an insulating substrate; a signal line which crosses the scan line; a driving circuit connected to the signal line and, in a region other than a display region constructed by the pixels, directly mounted on a terminal on the insulating substrate; and a stage disposed on the face of the insulating substrate, the driving circuit being not mounted on the face, wherein the method includes a step of connecting the terminal on the insulating substrate and the driving circuit by using an anisotropic conductive film in a state where a temperature of a face, which is in contact with the insulating substrate, of the stage is equal to or higher than a temperature of the anisotropic conductive film under the driving circuit.

According to the invention, there is also provided a second method of manufacturing a display including: a scan line for driving pixels formed on an insulating substrate; a signal line which crosses the scan line; a driving circuit connected to the signal line and, in a region other than a display region constructed by the pixels, directly mounted on a terminal on the insulating substrate; a stage disposed on the face of the insulating substrate, the driving circuit being not mounted on the face; and a compression bonding part disposed on the face opposite to a connection terminal in the driving circuit connected to the terminal on the insulating substrate, wherein the method includes a step of connecting the terminal on the insulating substrate and the driving circuit by using an anisotropic conductive film in a state where a temperature of a face, which is in contact with the insulating substrate of the stage is higher than a temperature of the face, which is in contact with the driving circuit, of the compression bonding part.

According to the invention, a third method of manufacturing a display is characterized in that, in the first or second method of manufacturing a display, the temperature of the face of the stage in contact with the insulating substrate is 150 to 220° C.

According to the invention, a fourth method of manufacturing a display is characterized by further including, in any of the first to third methods of manufacturing a display, a step of controlling the temperature of the face, which is in contact with the insulating substrate, of the stage when the terminal on the insulating substrate and the driving circuit are connected by using an anisotropic conductive film.

According to the invention, a fifth method of manufacturing a display is characterized by further including, in any of the first to fourth display methods of manufacturing a display, a step of cooling the face, which is in contact with the insulating substrate, of the stage after connection of the terminal on the insulating substrate and the driving circuit.

According to the invention, there is provided an apparatus for manufacturing a display including: a scan line for driving pixels formed on an insulating substrate; a signal line which crosses the scan line; a driving circuit connected to the signal line and, in a region other than a display region constructed by the pixels, directly mounted on a terminal on the insulating substrate; a stage disposed on the face of the insulating substrate on which the driving circuit is not mounted; and a compression bonding part disposed on the face opposite to a connection terminal in the driving circuit connected to the terminal on the insulating substrate, wherein the terminal on the insulating substrate and the driving circuit are connected to each other in a state where a temperature of a face, which is in contact with the insulating substrate, of the stage is higher than a temperature of the face, which is in contact with the driving circuit, of the compression bonding part.

BRIEF DESCRIPTION OF THE DRAWINGS

FIG. 4 is a diagram showing the relation between a warp amount of the insulating substrate and luminance nonuniformity in the first embodiment of the invention.

DETAILED DESCRIPTION

Embodiment 1

Figure 1:
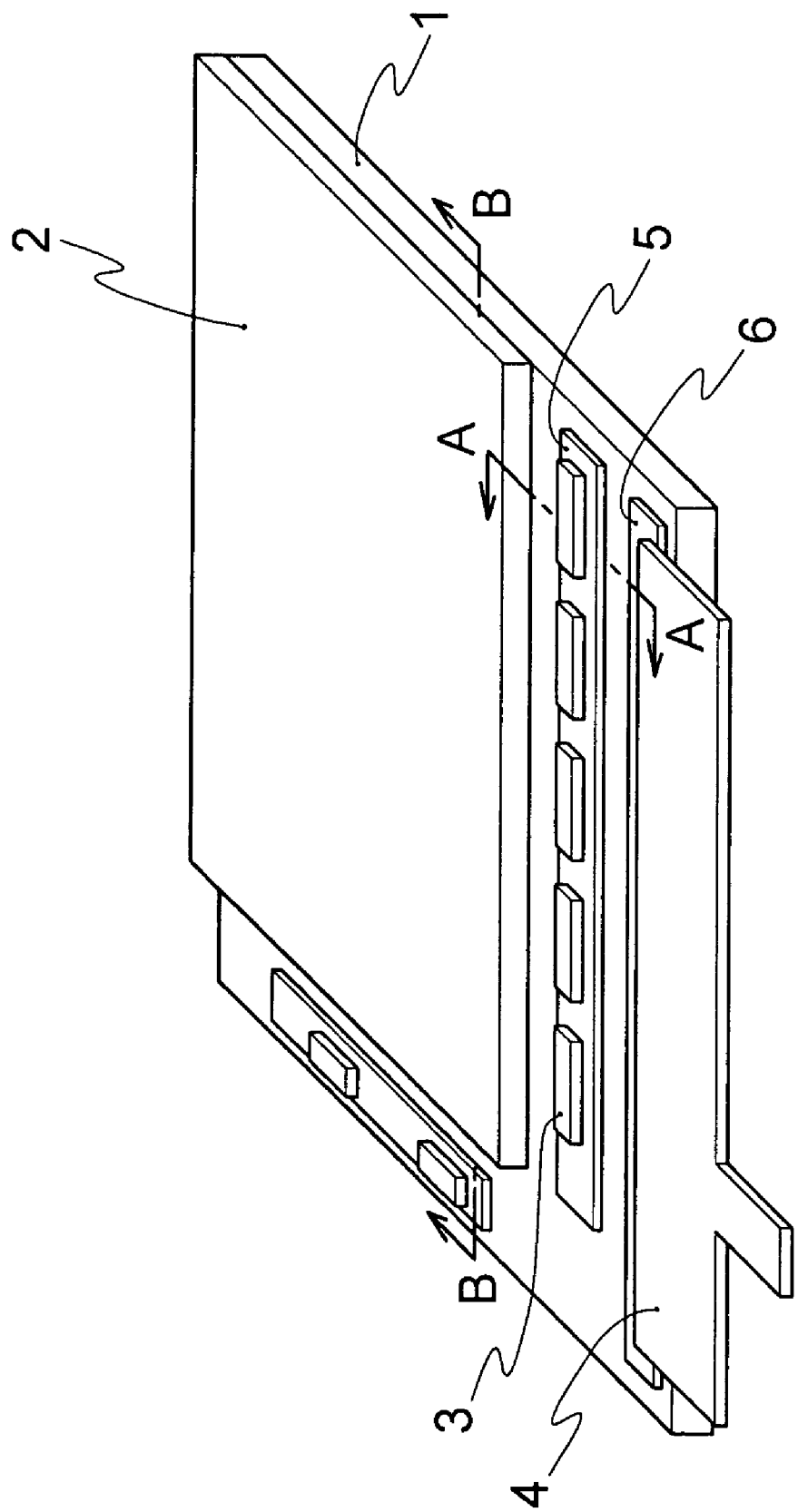
FIG. 1 is a perspective view of a liquid crystal display panel in a first embodiment of the present invention.

A first embodiment of the present invention will be described with reference to FIGS. 1 to 4.

In FIGS. 1 to 4, reference numeral 1 denotes an insulating substrate on which pixels are formed; 2 a counter substrate disposed so as to face the insulating substrate 1; 3 a driving circuit; 4 a flexible substrate to which signals are input from the outside; 5 an anisotropic conductive film for connecting the driving circuit to terminals on the insulating substrate; 5a an anisotropic conductive film disposed under the driving circuit; 6 an anisotropic conductive film for connecting the flexible substrate to a terminal on the insulating substrate; 7 a stage disposed on the side of a face of the insulating substrate 1 on which the driving circuit is not mounted; 8 a supporting plate for supporting the stage 7; 9 a base tool as a compression bonding part disposed on a face opposite to a connection terminal in the driving circuit connected to the terminal on the insulating substrate; 10 a supporter/heater for supporting the base tool 9; 11 a connection terminal of the driving circuit 3; and 12 a warp amount of the insulating substrate.

FIG. 1 is a perspective view showing a state where the driving circuit 3 is directly mounted on the insulating substrate 1 in a display (liquid crystal display in the embodiment). In the liquid crystal display, various patterns of a switching device, a pixel electrode, a source electrode, a gate wiring, a terminal and the like are formed by a metal film made of ITO, Cr, Al, Mo or the like, or by a semiconductor film made of a-Si or the like by using a photolithography technique or the like on the transparent insulating substrate 1. The counter substrate 2 disposed so as to face the insulating substrate 1 and having a surface which faces the insulating substrate 1 and on which color materials of red, green, and blue are applied is overlaid on the insulating substrate 1 with high precision and is thermo-compression bonded thereto. After that, the gap between the insulating substrate 1 and the counter substrate 2 is filled with a liquid crystal. In a region other than the display region constructed by pixels on the insulating substrate 1, a driving circuit connected to a scan line for driving a pixel and a driving circuit connected to a signal line for supplying a video signal, which crosses the scan line are directly mounted.

A method of connecting a terminal on the insulating substrate to the driving circuit will now be described. First, the surface of the terminal on the insulating substrate is cleaned with a limited-dusting wiping member dipped in ethanol or the like to remove conductive foreign matters. After that, the anisotropic conductive film 5 is transferred onto the terminal on the insulating substrate. The anisotropic conductive film is obtained by dispersing conductive particles formed by Ni/Au plating the surface of a plastic particle of 3 to 5 $\mu$m into an insulating resin which is mainly composed of an epoxy resin. In the driving circuit 3, an Au bump having a height of approximately 15 $\mu$m is formed by plating in a connection terminal portion for input/output. The connection terminal portion for input/output of the driving circuit 3 and the terminal on the liquid crystal display are aligned with high precision and are temporarily bonded by using a thermo-compression. After that, by using a thermo compression bonding tool, the anisotropic conductive film 5 is heated and pressurized under conditions of 150 to 190° C., 10 to 15 seconds, and 30 to 100 MPa. Since the thickness of the driving circuit varies, a compression bonding tool of a type independent for each driving circuit is generally used. By performing the thermo compression bonding under the above conditions, the conductive particles in the anisotropic conductive film existing on the terminal on the insulating substrate are pressed and flattened by the Au bumps of the driving circuit and are made conductive in the vertical direction. However, in the direction parallel to the insulating substrate, due to existence of the insulating epoxy resin around each of the conductive particles, insulation is maintained.

Further, the flexible substrate 4 for inputting a signal from the outside and the terminal on the insulating substrate are connected to each other via the anisotropic conductive film 6.

Figure 2:
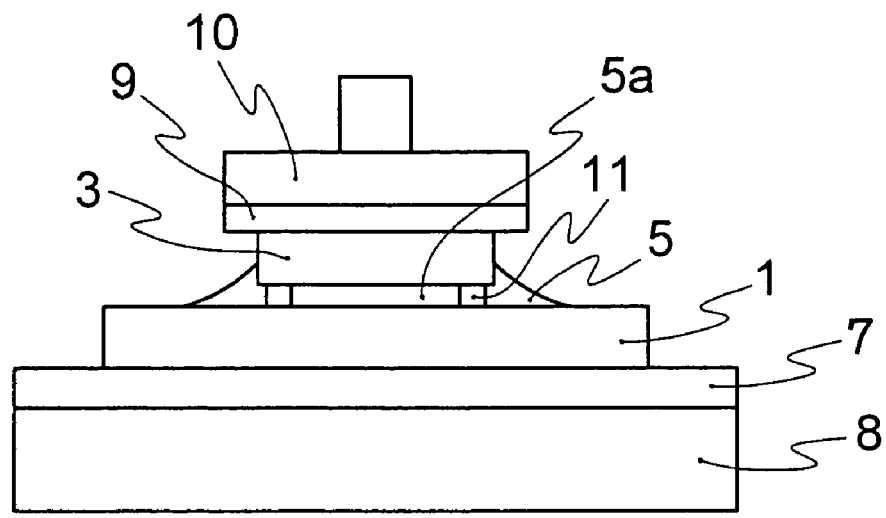
FIG. 2 is a sectional view taken along the line A—A showing a state where a driving circuit in FIG. 1 is mounted.
Figure 3:
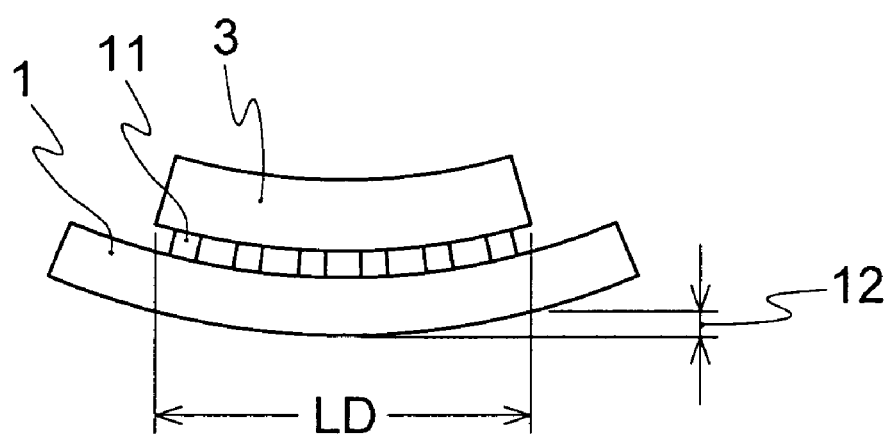
FIG. 3 is a sectional view illustrating a warp amount in the first embodiment of the present invention.

FIG. 2 is a sectional view taken along the line A—A (cross section in the direction of a short side) showing a state where the driving circuit in FIG. 1 is mounted. FIG. 2 is a sectional view of the driving circuit connected to a signal line in which luminance nonuniformity conspicuously occurs. In the compression bonding tool, the supporter/heater 10 capable of freely controlling the temperature during pressurization and the base tool 9 disposed on the side of the face of the supporter/heater 10 in contact with the driving circuit are disposed. As the supporter/heater 10, a ceramic heater, a pulse heater, or the like is used. Further, an SUS or the like is used as the supporting plate 8 disposed on the side of the face of the insulating substrate on which the driving circuit is not mounted. On the face, which is in contact with the insulating substrate, of the supporting plate 8, the stage 7 formed by a ceramic heater or the like is disposed so that the insulating substrate 1 can be heated in a short time. To facilitate control of the temperature of the stage 7 during compression bonding between the driving circuit and the terminal on the insulating substrate, a plate having a low heat conductivity such as ceramic might be disposed between the supporting plate 8 and the stage 7.

A manufacturing method and a manufacturing apparatus at the time of thermo compression bonding between a connection terminal of the driving circuit and a terminal on the insulating substrate will now be described. At the time point when the insulating substrate 1 to which the driving circuit 3 is temporarily compression bonded by the anisotropic conductive film 5 is moved onto the stage 7, the temperature of the face, which is in contact with the insulating substrate, of the stage 7 is set to a temperature sufficiently lower than a glass-transition temperature Tg of the anisotropic conductive film 5a under the driving circuit 3. After that, the base tool 9 and the supporter/heater 10 are allowed to come into contact with the driving circuit 3 and heating and pressurization is performed. At this time, both the base tool 9 and the stage 7 are heated and it is controlled so that the temperature of the face of the stage 7 which is in contact with the side of the face of the insulating substrate 1 on which the driving circuit 3 is not mounted becomes higher than the temperature of the face, which is in contact with the driving circuit, of the base tool 9. It is preferable to control the surface temperature of the stage 7 equal to or higher than the temperature of the anisotropic conductive film 5a under the driving circuit 3.

After lapse of the set compression bonding time, while maintaining the pressurized state, the temperature of the stage 7 and the base tool 9 is decreased rapidly (for example, a few seconds to tens seconds) to a temperature (for example, 70 to 80° C.) which is sufficiently lower than the glass-transition temperature of the anisotropic conductive film 5 or 5a. It is also possible to provide a cooling mechanism with an air or the like for the stage 7 and to forcedly decrease the temperature rapidly. After that, the base tool 9 is removed from the driving circuit 3, and the compression bonding process is completed.

TABLE 1

| Compression bonding condition | Warp amount |
| --- | --- |
| Compression bonding of 190° C., Unheated stage | 8 μm |
| Compression bonding of 160° C., Unheated stage | 5 μm |
| Compression bonding of 160° C., Heated stage | ≦2 μm |

Table 1 shows the relation between the compression bonding conditions at the time of mounting the driving circuit and the warp amount of the insulating substrate. Table 1 shows: the warp amount of the under face side of the portion, on which the driving circuit is mounted, of the insulating substrate in the case of employing the manufacturing method or the manufacturing apparatus and mounting the driving circuit directly to the terminal on the insulating substrate; and the warp amount in the case where a constant heater is used as the base tool, a heating mechanism is not provided for the stage, and the base tool is taken away from the driving circuit immediately after lapse of compression-bonding time. As shown in the sectional view in the direction of a long side of the driving circuit 3 connected to the signal line of FIG. 3, the warp amount of the insulating substrate in the specification denotes the difference 12 between the maximum value and the minimum value in the direction perpendicular to the insulating substrate within the range (LD in FIG. 3) of the driving circuit in the direction of a long side of the driving circuit in the center line in the direction of a short side of the driving circuit on the side of the face on which the driving circuit 3 is not mounted, of the insulating substrate 1.

It is recognized from Table 1 that when the manufacturing method or apparatus in which the surface temperature of the stage 7 at the time of compression bonding is set to be equal to or higher than the temperature of the anisotropic conductive film 5a under the driving circuit 3 or higher than the temperature (for example, 150 to 220° C.) of the face, which is in contact with the driving circuit 3, of the base tool 9 as a compression bonding part is used, the warp amount of the insulating substrate is 2 μm or less. In contrast, when the manufacturing method or apparatus in which the stage is not heated is employed, the warp amount of the insulating substrate is 5 μm or larger. The surface temperature of the stage 7 might be equal to or higher than the temperature of the anisotropic conductive film 5a under the driving circuit 3 or higher than the temperature of the face, which is in contact with the driving circuit 3, of the base tool 9 as the compression bonding part. Since the curing temperature of the anisotropic conductive film is generally approximately 150 to 160° C., if the temperature becomes 220° C. or higher, a bad influence of heat is exerted on the other parts (such as a polarizing plate). Consequently, when the thickness of the insulating substrate 1 is substantially approximately 0.7 mm, the temperature from 150 to 220° C. is preferable. In the case where the thickness of the insulating substrate 1 is substantially approximately 0.5 mm, since the curing temperature of the anisotropic conductive film is generally approximately 150 to 160° C., and since a bad influence of heat is exerted on the other parts (such as a polarizing plate) if the temperature is 200° C. or higher, the temperature from 150 to 200° C. is preferable.

FIG. 4 shows situations of occurrence of luminance nonuniformity in the case where the warp amount is 5 μm and those in the case where the warp amount is 2 μm. In FIG. 4, the solid line indicates the case where the warp amount is 5 μm and the broken line indicates the case where the warp amount is 2 μm. The vertical axis shows luminance at the time when black is displayed on the whole display screen. The lateral axis shows the position on the inner side (B—B line in FIG. 1) by approximately 5 mm to the center of a display area, from a side close to the side on which the driving circuit is mounted on the signal line, in the display region of the liquid crystal display panel. From FIG. 4, it is understood that luminance nonuniformity is hardly recognized in the broken line showing a state where the stage 7 is heated and the warp amount is set to 2 µm. On the other hand, the solid line showing a case where the stage 7 is not heated and the warp amount to 5 µm displays a large distribution width of luminance, light escape occurs in the gap between the stage and the driving circuit mounted, and luminance nonuniformity is recognized. Therefore, by connecting the driving circuit and the terminal on the insulating substrate in a state where the surface temperature of the stage 7 is set to be equal to or higher than the temperature of the anisotropic conductive film 5a under the driving circuit 3 or higher than the temperature of the surface, which is in contact with the driving circuit 3, of the base tool 9 as a compression bonding part to thereby set the warp amount of the insulating substrate to 2 µm or less, the display realizing suppressed luminance nonuniformity and high display quality can be obtained. In the cases where the thickness of the insulating substrate 1 is substantially 0.7 mm or 0.5 mm, in order to suppress luminance nonuniformity irrespective of the thickness of the insulating substrate, the warp amount of the insulating substrate is preferably set to 2 µm or less by using the manufacturing method or apparatus.

It is also possible to scan the face of the stage on the opposite side of the insulating substrate on which the driving circuit is mounted by using, for example, a laser displacement meter or the like after compression-bonding the driving circuit to the terminal on the insulating substrate and to measure the warp amount of the insulating substrate.

Although the display using a liquid crystal has been described as the display in the foregoing embodiment, the invention is not limited to the liquid crystal display. Obviously, the invention can be also applied to any of displays in which a driving circuit is directly connected to a terminal on an insulating substrate, such as a display using an electroluminescence device, field sequential or the like.

According to the invention, by connecting the driving circuit to the terminal on the insulating substrate in a state where the surface temperature of the stage disposed on the side of a face of the insulating substrate on which the driving circuit is not mounted is set to be equal to or higher than the temperature of the anisotropic conductive film under the driving circuit or higher than the temperature of the surface, which is in contact with the driving circuit of the compression bonding part, the warp amount of the insulating substrate, which occurs when the driving circuit is directly mounted on a terminal on the insulating substrate, is set to 2 µm or less, and the display realizing suppressed luminance nonuniformity and high display quality can be obtained.

What is claimed is:

1. A display comprising: a scan line for driving pixels formed on an insulating substrate; a signal line which crosses the scan line; and a driving circuit connected to the signal line and, in a region other than a display region constructed by the pixels, directly mounted on the insulating substrate, wherein a warp amount of a portion corresponding to the region in which the driving circuit is mounted, in a face opposite to the side of the insulating substrate, on which the driving circuit is mounted, is 2 µm or less.

2. The display of claim 1, wherein the driving circuit and a terminal on the insulating substrate are connected to each other by an anisotropic conductive film.

* * * * *